United States Patent [19]
Kalb, Jr.

[11] Patent Number: 5,986,461
[45] Date of Patent: Nov. 16, 1999

[54] UV METHODS FOR SCREENING OPEN CIRCUIT DEFECTS IN CMOS INTEGRATED CIRCUITS

[75] Inventor: Jeffrey C. Kalb, Jr., Phoenix, Ariz.

[73] Assignee: Intel Corporation, Santa Clara, Calif.

[21] Appl. No.: 08/718,632

[22] Filed: Sep. 17, 1996

[51] Int. Cl.[6] .................................................... G01R 31/02
[52] U.S. Cl. .......................................... 324/765; 324/752
[58] Field of Search .................................... 324/750, 751, 324/752, 765, 158.1, 73.1; 438/14, 17, 18; 257/40, 48; 250/310, 311; 371/22.1, 22.6; 714/25, 30, 724, 733, 734

[56] References Cited

U.S. PATENT DOCUMENTS

| | | |
|---|---|---|
| 4,100,563 | 7/1978 | Clark . |
| 4,683,429 | 7/1987 | Popovic . |
| 4,700,211 | 10/1987 | Popovic et al. . |
| 4,710,704 | 12/1987 | Ando . |
| 4,736,159 | 4/1988 | Shiragasawa et al. ................... 324/158 |
| 4,837,506 | 6/1989 | Patterson ................................. 324/752 |
| 4,893,073 | 1/1990 | McDonald et al. . |
| 4,926,116 | 5/1990 | Talisa . |
| 4,967,152 | 10/1990 | Patterson ................................. 324/752 |
| 5,150,043 | 9/1992 | Flesner ..................................... 324/158 |
| 5,153,557 | 10/1992 | Partin et al. . |
| 5,247,278 | 9/1993 | Pant et al. . |
| 5,334,540 | 8/1994 | Ishii ............................................ 437/7 |
| 5,392,293 | 2/1995 | Hsue . |
| 5,420,522 | 5/1995 | Smayling ................................. 324/765 |
| 5,640,099 | 6/1997 | Sanada .................................... 324/752 |
| 5,790,565 | 8/1998 | Sakaguchi ............................. 371/22.1 |
| 5,804,980 | 9/1998 | Nikawa ................................... 324/752 |

OTHER PUBLICATIONS

"An Evaluation of IDDQ Versus Conventional Testing for CMOS Sea–of–Gate IC's", K. Sawada and S. Kayano, ASIC Design Engineering Center, Mitsubishi Electric Corporation, 1992 IEEE (unavailable month).

"IDDQ Testing Makes a Comeback", Dan Ramanchik, *Test & Measurement World*, Oct., 1993, p. 58.

"Built–In Current Testing—Feasibility Study", Wojciech Maly and Phil Nigh, Department of Electrical and Computer Engineering, Carnegie Mellon University, 1988 IEEE (unavailable month).

"Master Series IDDQ Product Description—R0.4–Preliminary Jan. 94", *Master Series IDDQ Monitor*, Copyright 1991/1992, LTX Corporation.

Built–in Current Sensor for IDDQ Test in CMOS, Ching–Wen Hsue and Chih–Jen Lin, AT&T Bell Laboratories, 1993 IEEE (unavailable month).

"Circuit Design for Built–In Current Testing", Yukija Miura and Kozo Kinoshita, Department of Applied Physics, Osaka University, 1992 IEEE (unavailable month.

(List continued on next page.)

*Primary Examiner*—Vinh P. Nguyen
*Attorney, Agent, or Firm*—Blakely, Sokoloff, Taylor & Zafman LLP

[57] ABSTRACT

A method for detecting defects in a CMOS integrated circuit. In one embodiment, all pins on an integrated circuit chip are initially grounded. Next, the chip is exposed to ultraviolet light which will discharge the voltage on a floating gate in the integrated circuit to zero volts. Next, the chip is powered up to a normal operating condition voltage levels. That is, normal operating voltages are applied to $V_{CC}$ while $V_{SS}$ pins remain grounded. As a result, the floating gates in the integrated circuit will stabilize at an intermediate logic value determined by the voltage divider relationship determined by the parasitic capacitances between the floating gates, $V_{CC}$ and $V_{SS}$. Next, IDDQ testing is performed on the chip. Since the floating gates have been set to an intermediate logical value, any floating gate defects will be detected with IDDQ testing since a substantially high quiescent current will result with the floating gate node voltages set to an intermediate value. Thus, in accordance with the teachings of the present invention, devices suffering from open circuit floating gate may be identified.

4 Claims, 7 Drawing Sheets

OTHER PUBLICATIONS

"A General Purpose IDDQ Measurement Circuit", Kenneth M. Wallquist, Alan W. Righter and Charles F. Hawkins, Electrical & Computer Engineering Department, The University of New Mexico, 1993 International Test Conference (unavailable month).

"IDDQ and Reliability", Robert C. Aitken, Design Technology Center, Palo Alto, California, Apr. 26, 1994, Hewlett–Packard.

"IDDQ Background Paper on Sematech/Sandia/UNM Project", Alan Righter & Chuck Hawkins, Apr. 4, 1994, The University of New Mexico Electrical and Computer Engineering Dept.

UV METHODS FOR SCREENING OPEN CIRCUIT DEFECTS IN CMOS INTEGRATED CIRCUITS

BACKGROUND OF THE INVENTION

1. Field of the Invention

The present invention relates generally to integrated circuits and more specifically, the present invention relates to the testing of integrated circuits.

2. Description of the Related Art

Present state of the art methods for detecting open circuit defects in CMOS integrated circuits include Boolean logic and IDDQ tests. FIG. 1 shows a schematic of a simple CMOS integrated circuit 101 with an open circuit defect 107. Integrated circuit 101 includes an inverter 103 with an output coupled to be received by the input of inverter 105. With open circuit defect 107, however, the gates of inverter 105 are decoupled from the output drive of inverter 103 and therefore float at an unknown potential. Moreover, with open circuit defect 107, the level generated at OUT 113 is independent of the level input at IN 111.

With Boolean testing, circuit testers can detect open circuit defects by applying signals of a known level at IN 111 and verify the signals generated at OUT 113. If the signal output at OUT 113 is inconsistent with the signal input at IN 111, open circuit defect 107 may be identified. A limitation with Boolean testing is associated with the fact that modern very large scale integrated circuits commonly have over 10 million transistors. With such a large number of transistors and a limited number of pins, it is very difficult to realize observability of all nodes on the chip. As a result, it is practically impossible to toggle all of the nodes in the chip and thus difficult to screen for open circuit defects within modern CMOS integrated circuits using only Boolean testing.

Another method used to detect defects in CMOS integrated circuits is IDDQ testing. CMOS integrated circuits are popular for their low power characteristics. If the design is static, the current should be nearly zero in an ideal CMOS circuit during standby or a quiescent state. Thus, when a CMOS circuit is not switching states, only a small amount of current should be drawn by the circuit. This quiescent current, commonly referred to as IDDQ, is composed primarily of leakage current. A faulty CMOS circuit may draw a significantly larger amount of current than a properly functioning CMOS circuit when in the quiescent state.

An abnormally high IDDQ may result from a variety of problems which includes defects such as gate oxide shorts, interconnect bridging shorts and interconnect open circuits. By measuring the IDDQ of a CMOS circuit and comparing it with the IDDQ of a known properly functioning CMOS circuit, a faulty circuit can be detected.

In FIG. 1, IDDQ 109 is shown flowing through inverter 105. If the voltage at the gates of the transistors in inverter 105 is high, then the n-channel transistor of inverter 105 is switched off and IDDQ is substantially zero. Conversely, if the voltage at the gates of the transistors in inverter 105 is low, then the p-channel transistor of inverter 105 is switched off and IDDQ 109 is also substantially zero. If, however, there is for example a short circuit defect in a transistor or if the voltage at the gates of the transistors of inverter 105 is at an intermediate value, then both the p-channel transistor and the n-channel transistor will leak a significant amount of current which would therefore result in a substantially high IDDQ 109 current. The abnormally high IDDQ 109 would indicate the presence of a defect.

As shown in FIG. 1, open circuit defects decouple the gates of an input stage from the previous drive stages. Such gates are said to be floating. Since there is no significant conductive path to the gates, the gate potential remains at an unknown value determined in part by minor sources of leakage or by charge placed on the gate during processing. Often, such leakage or processing will set a potential on the gate in which the MOS device is fully shut off. In such a state, which cannot be altered by exercising the part or by any other means open to the test environment, leakage is virtually zero and differentiating such a part from a non-defective part is not possible within a conventional IDDQ test method. For example, in FIG. 1, if the gates of inverter 105 are floating at a logical "0" or "1," IDDQ testing will not detect the open circuit defect 107 since IDDQ 109 will be substantially zero.

Therefore, what is desired is a simple method for detecting open circuit defects in CMOS integrated circuits. Such a method would allow circuit testers to set the voltage at floating gates of an integrated circuit to intermediate values so as to provide better screening for open circuit defects within CMOS integrated circuits.

SUMMARY OF THE INVENTION

A method for detecting defects in a CMOS integrated circuit is disclosed. In one embodiment, the integrated circuit is irradiated and then IDDQ testing is performed in the integrated circuit. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

DETAILED DESCRIPTION

A method for detecting defects in a CMOS integrated circuit is disclosed. In the following description, numerous specific details are set forth such as example schematics and circuit couplings in order to provide a thorough understanding of the present invention. It will be apparent, however, to one having ordinary skill in the art that the specific details need not be employed to practice the present invention. In other instances, well known materials or methods or methods have not been described in order to avoid obscuring the present invention.

The present invention details how ultraviolet light treatment may be used to improve test coverage of open circuits in IDDQ testing. This improvement in test coverage improves outgoing quality of CMOS integrated circuits. In so doing, it decreases costs due to loss of package parts by improving the screening process during integrated circuit tests.

Figure 1:
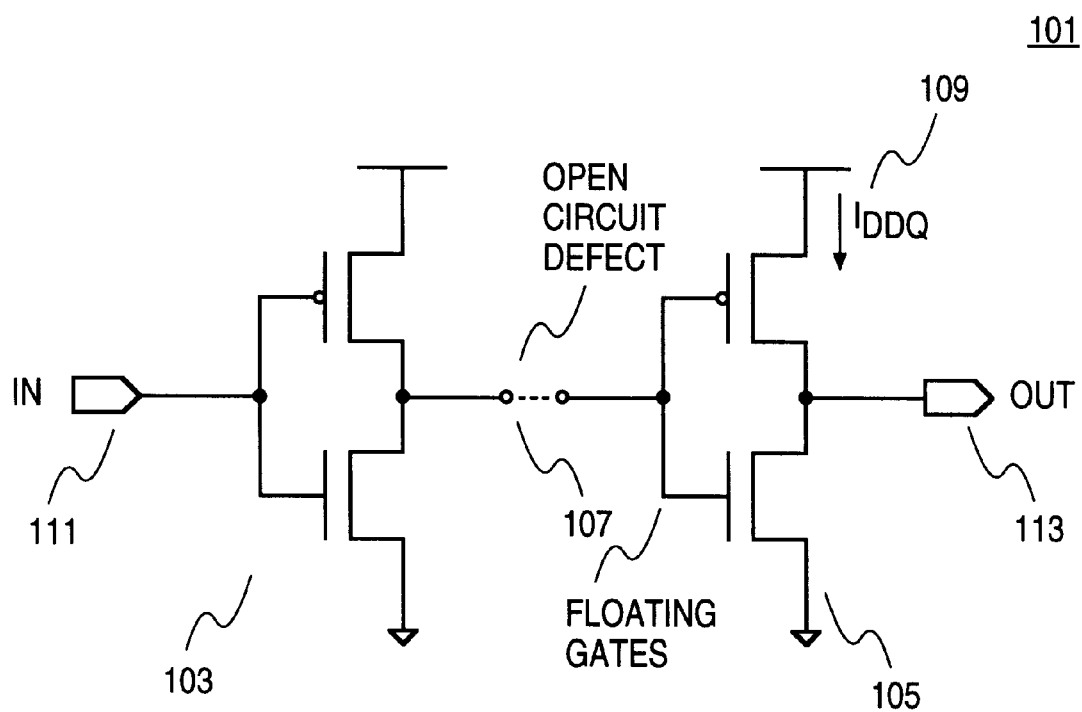
FIG. 1 is a schematic of a CMOS integrated circuit with an open circuit defect.
Figure 2:
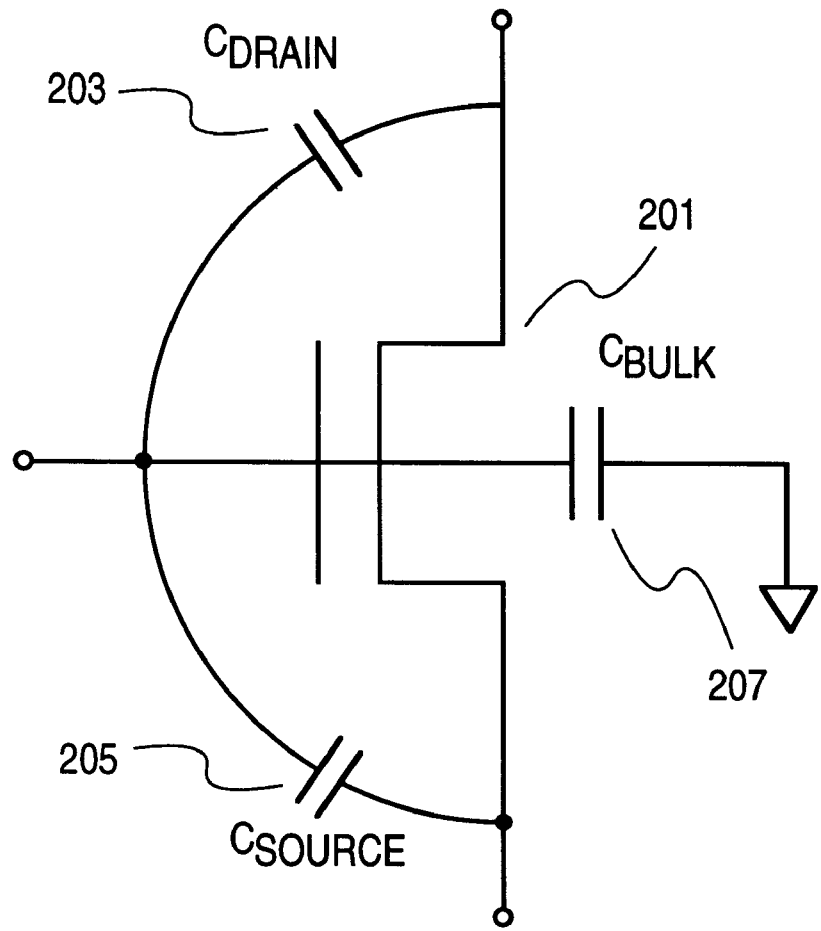
FIG. 2 is a schematic of an ordinary n-channel MOS transistor with the parasitic capacitances of the gate shown.

Radiation such as ultraviolet light may be used as a means of discharging floating gates such as the gates of inverter 105 of FIG. 1. In particular, FIG. 2 shows an ordinary n-channel transistor with parasitic capacitances $C_{DRAIN}$ 203, $C_{SOURCE}$ 205 and $C_{BULK}$ 207 coupled between the gate of transistor 201 and respective nodes. Parasitic capacitance $C_{DRAIN}$ 203 is coupled between the gate of n-channel transistor 201 and its drain. Parasitic capacitance $C_{SOURCE}$ 205 is coupled between the gate of n-channel transistor 201 and the source of n-channel transistor 201. Parasitic capacitance $C_{BULK}$ 207 is coupled between the gate of n-channel transistor 201 and the bulk. By irradiating the n-channel transistor 201 with radiation such as ultraviolet light, there is a massive generation of electron-hole pairs which effectively result in parasitic capacitances 203, 205 and 207 temporarily becoming resistive paths. That is, the electron-hole pair charge carriers provide a conduction path from the gate of n-channel transistor 201 to the neighboring elements in the transistor. Therefore, if the gate of transistor 201 is a floating gate, the gate of transistor 201 will be discharged via the radiation induced conduction paths. As a result, by flooding the part with radiation such as ultraviolet light, one may substantially modify the gate potentials of all floating nodes. The resulting potential on a particular floating node will be a complex function of its geometric relationship to its neighbors, the gates to which it is coupled, the voltage at which the part is operating, and the logical states of surrounding nodal neighbors.

Referring back to FIG. 2, if the source, drain and bulk of n-channel transistor 201 were tied to a known potential taken to be zero volts, and assuming that the gate of transistor 201 is a floating gate, the voltage on the gate of transistor 201 would be discharged to zero volts during irradiation treatment since each of the neighboring nodes have been set to zero volts.

Figure 3:
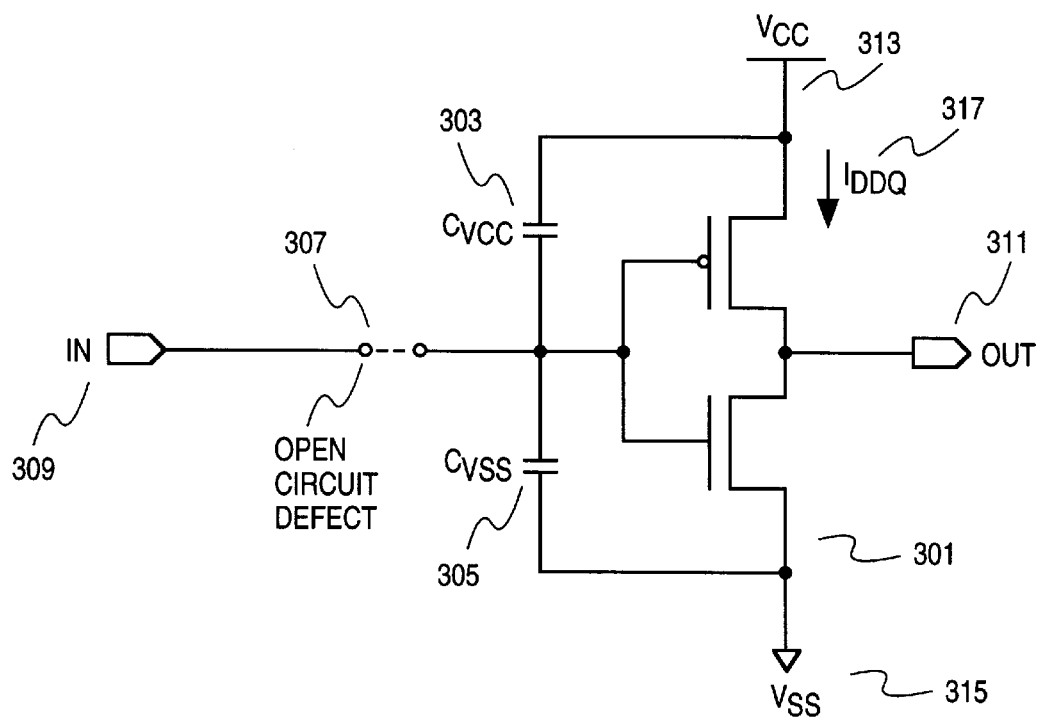
FIG. 3 is a schematic of a CMOS integrated circuit with an open circuit defect and parasitic capacitances of the floating gate to $V_{cc}$ and $V_{ss}$ shown.

Referring now to FIG. 3, once ultraviolet light treatment has been completed and the floating gates of an integrated circuit have been discharged to for example zero volts, $V_{cc}$ and $V_{ss}$ may then be set to their normal operating values. At this time, the voltage at the floating gate of the integrating circuit will stabilize at an intermediate voltage somewhere between $V_{cc}$ and $V_{ss}$. This intermediate voltage will be reached as a result of the parasitic capacitances which exist between the floating gates and $V_{cc}$ and $V_{ss}$.

To illustrate, FIG. 3 shows an inverter 301 with an open circuit defect 307 existing between the input IN 309 of the inverter and the gates of the transistors of inverter 301. Thus, the gates of the transistors of inverter 301 are floating. Assuming that inverter 301 has been treated with ultraviolet light as described above and that $V_{cc}$ 313 and $V_{ss}$ 315 were tied to zero volts during the application of the ultraviolet light, the floating gates of inverter 301 will be discharged to substantially zero volts. Afterwards, $V_{cc}$ may be coupled to a normal operating voltage such as for example 5 volts and $V_{ss}$ may be coupled to an operating voltage of zero volts. As a result, the voltage at the floating gate of inverter 301 will be determined by a voltage divider relationship with the parasitic capacitances existing between the gates of inverter 301, $V_{cc}$ 313 and $V_{ss}$ 315. As shown in FIG. 3, parasitic capacitance $C_{VCC}$ 303 exists between the floating gates of inverter 301 $V_{cc}$. Parasitic capacitance $C_{VSS}$ 305 exists between the floating gates of inverter 301 and $V_{ss}$ 315. Thus, the voltage at the floating gates of inverter 301 will stabilize at a voltage substantially equal to:

$$V_{CC} \cdot \frac{C_{VCC}}{C_{VCC} + C_{VSS}} \qquad \text{(Equation 1)}$$

Therefore, assuming that parasitic capacitance $C_{vcc}$ 303 is approximately equal to parasitic capacitance $C_{vss}$ 305, the voltage at the floating gates of inverter 301 will be equal to approximately the mid-point voltage between $V_{ss}$ 315 and $V_{cc}$ 313. For example, if $V_{ss}$ 315 is equal to zero volts and $V_{cc}$ 313 is equal to 5 volts, the floating gates of inverter 301 will stabilize at a value of approximately 2.5 volts. With the floating gate of inverter 301 at an intermediate logic level of 2.5 volts, a substantial leakage current will flow through inverter 301 independent of the voltage set at IN 309. Consequently, quiescent current IDDQ 317 will be substantially greater than zero. Thus, with the teachings of the present invention, floating gate defects in a CMOS integrated circuit may be detected using IDDQ testing since the floating gates of inverter 301 may be set to an intermediate logic level.

It is noted that integrated circuits which do not suffer from a floating gate defect will not exhibit an appreciable change in quiescent current with ultraviolet light treatment. Having been temporarily influenced by an ultraviolet light exposure, all nodes in an integrated circuit will discharge to proper levels determined by the state of the previous driver circuit. With an open circuit defect, however, floating gates will be unaffected by the state of the previous driver circuit since there is no conductive path between the previous driver circuit and the floating gate.

It is also appreciated that in accordance with the teachings of the present invention, Boolean testing may also be benefited by the application of ultraviolet light to the circuit for detecting floating gate defects. In particular, with floating gate nodes set to an intermediate level, the output voltage and drive of integrated circuits with gate inputs set at an intermediate voltage will cause the outputs of subsequent stages of the integrated circuit to be unpredictable which will likely cause the integrated circuit to fail Boolean device testing.

In one embodiment of the present invention, ordinary ultraviolet lamps used for programming erasable programmable read only memories (EPROMs) are used for irradiating the integrated circuits under test to detect floating gate defects. These ultraviolet lamps are widely available and thus add minimal costs to existing testing schemes. It is appreciated that other types of radiation lamps may be used so long as the radiation frequency output by such lamps is sufficient to adequately excite electron-hole pairs used to bleed charge from floating gates.

Figure 4:
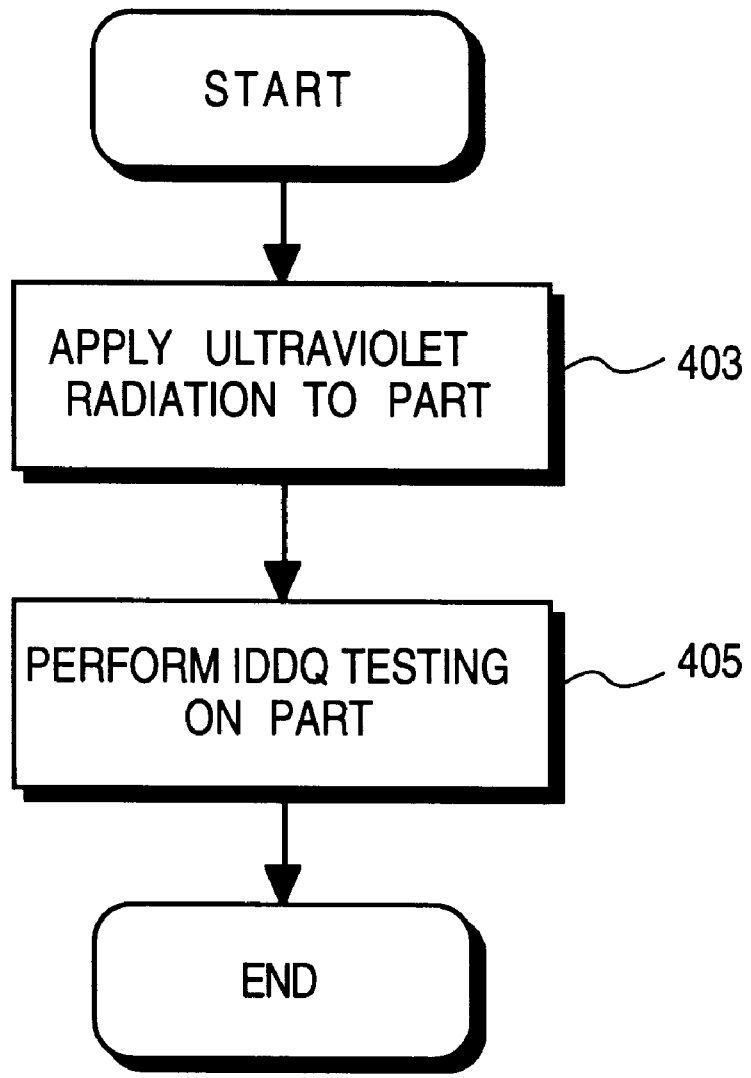
FIG. 4 is a flow diagram of one embodiment of the present invention.

FIG. 4 is a simplified flow diagram 401 illustrating steps to be performed in accordance with the teachings of the present invention. As shown in block 403, ultraviolet radiation is applied to the part. Next, as shown in block 405, normal IDDQ testing is performed on the part. With the application of ultraviolet light to the part, floating gates in the part will be set to an intermediate value which therefore allows floating gate defects to be detected during IDDQ testing during block 405.

Figure 5:
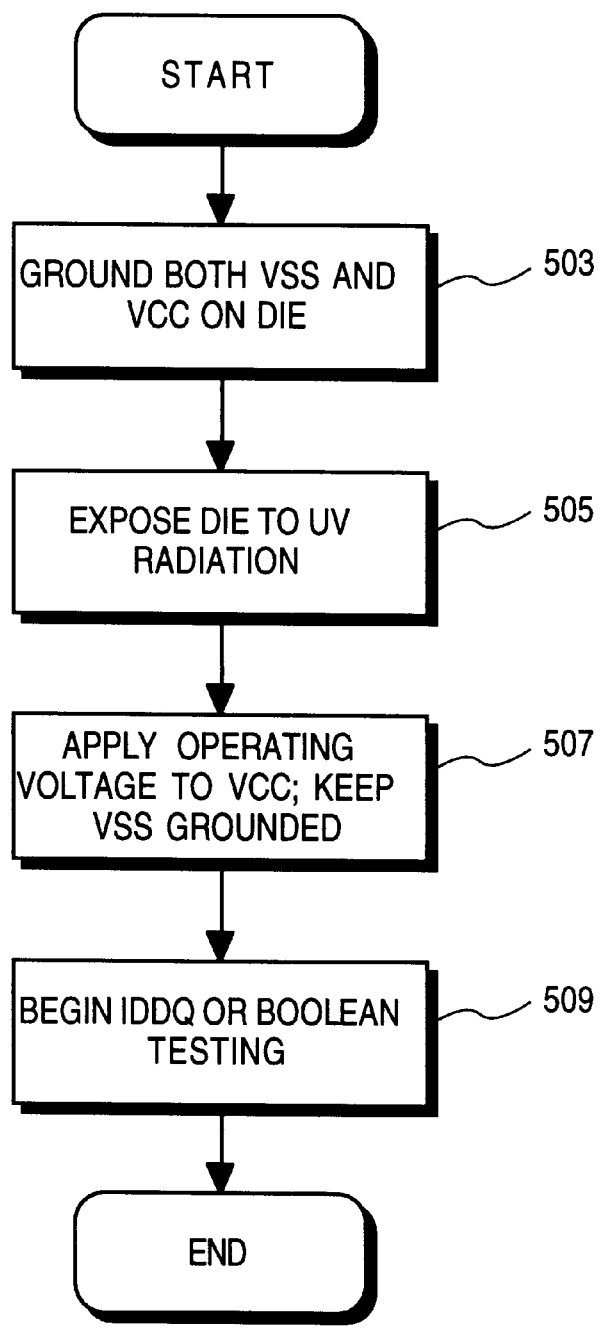
FIG. 5 is a flow diagram of another embodiment of the present invention.

FIG. 5 is a more detailed flow diagram 501 illustrating steps to be performed in accordance with the teachings of the present invention. As indicated in block 503, the pins of a part are grounded such that both $V_{ss}$ and $V_{cc}$ are set to zero volts. Afterwards, the die is exposed to ultraviolet radiation which will bleed charge from a floating gate and therefore set the voltage at the floating gate to zero volts. As shown in block 507, the normal operating voltage is then applied to $V_{cc}$ and $V_{ss}$ which results in the voltage at any floating gate on the die to stabilize at an intermediate value. Then, at block 509, normal IDDQ testing or Boolean testing will then be performed. With any floating gate set to an intermediate value, IDDQ testing and Boolean testing will detect defects on the die.

Figure 6:
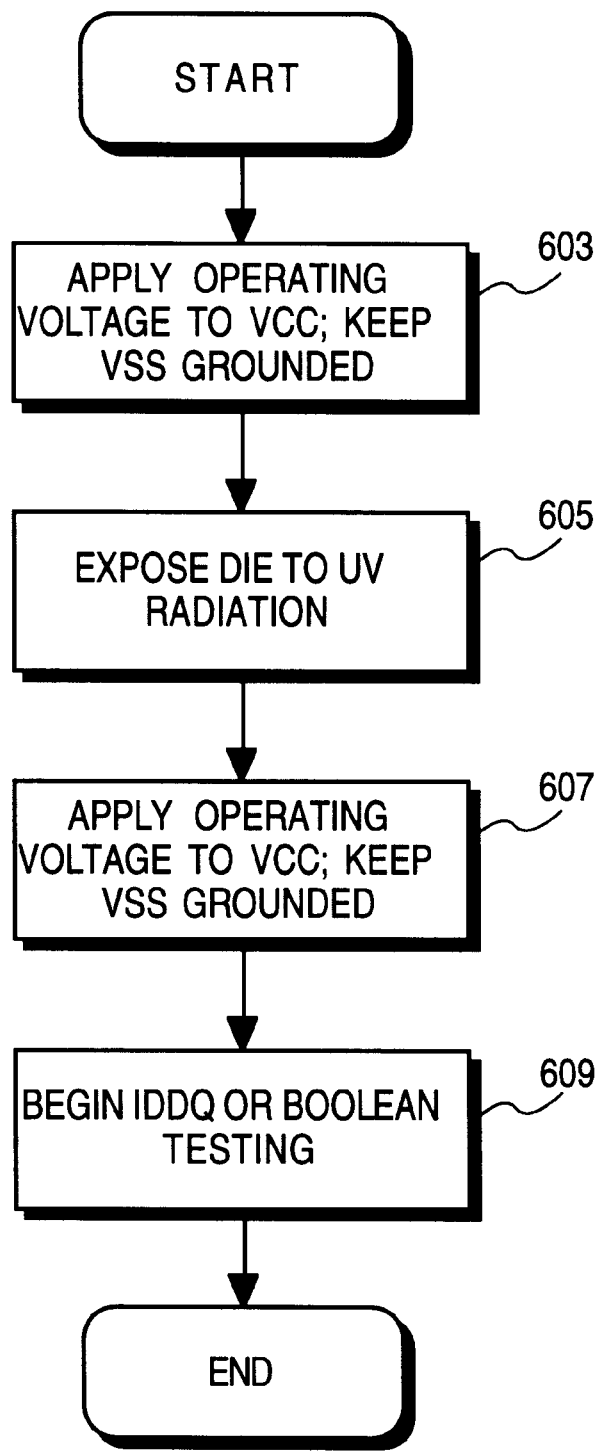
FIG. 6 is a flow diagram of yet another embodiment of the present invention.

In another embodiment shown in flow diagram 601 of FIG. 6, it is noted that the normal operating voltage may be applied to $V_{cc}$ with $V_{ss}$ grounded as shown in block 603. Afterwards, the die may be exposed to ultraviolet radiation which would still result in the voltage at a floating gate in the chip to be set to a value somewhere between $V_{ss}$ and $V_{cc}$. Consequently, as indicated in block 607, the voltage at any of the floating gates in the chip will stabilize at an intermediate value between $V_{cc}$ and $V_{ss}$. As a result, as indicated in block 609, IDDQ or Boolean testing will still be able to effectively detect defects such as floating gates in the integrated circuit under test.

It is appreciated that with $V_{cc}$ tied to its normal value when bathing the chip in ultraviolet radiation, a lower intensity of radiation might be applied in order to prevent damage to the chip which might result in latch up. Nevertheless, tying $V_{cc}$ and $V_{ss}$ to their normal values during irradiation with ultraviolet light will result in a floating gate in the integrated circuit being set to an intermediate value between $V_{ss}$ and $V_{cc}$, thus providing effective screening for open circuit defects within the integrated circuit.

Figure 7:
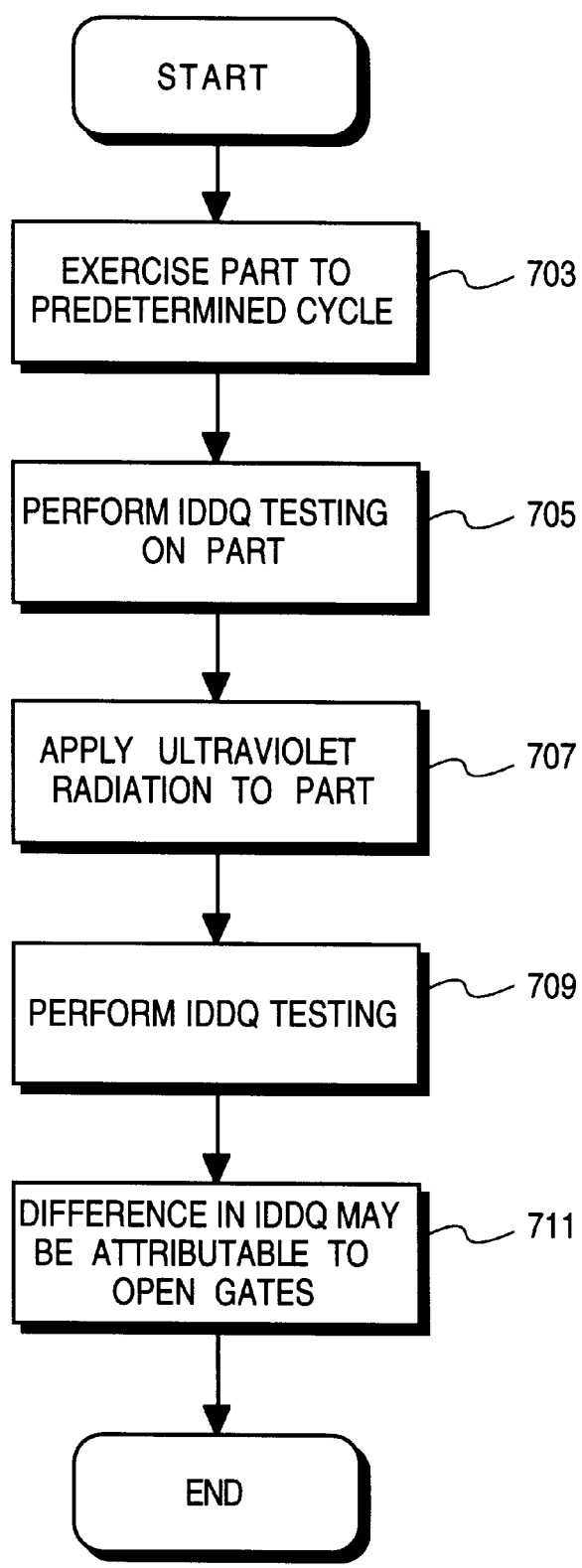
FIG. 7 is a flow diagram of yet another embodiment of the present invention.

FIG. 7 is a flow diagram 701 of yet another embodiment of the present invention. As indicated above, the voltage of floating gate nodes will be determined by the complex function of its geometric relationship to its neighbors, the gates to which it is coupled, the voltage at which the part is operating, and the logical states of surrounding nodal neighbors. Irradiating the part with ultraviolet radiation during different states of operation will result in different voltages being set at the floating gates of a defective integrated circuit. Consequently, different voltages at neighboring nodes of a floating gate in an integrated circuit during irradiation will result in different voltages being set at the floating gates of the defective integrated circuit. With different voltages at the floating gates, the resulting IDDQ measurements will also be affected. That is, different IDDQ measurements will result if the floating gates are irradiated with ultraviolet radiation during different logical states of the integrated circuit. Any significant differences in IDDQ may therefore be attributed to floating gate defects since devices which do not suffer from floating gate defects will not exhibit an appreciable change in quiescent current.

FIG. 7 shows a flow diagram 701 which summarizes the steps described above. As indicated in block 703, the part is exercised until it rests in a particular predetermined cycle. As indicated in block 705, IDDQ testing is then performed on the part. Next, ultraviolet light is then applied to the part. Afterwards, IDDQ testing is performed again as indicated in block 709. Any differences in IDDQ between the two different IDDQ measurements may be attributed to floating gate defects as indicated in block 711.

It is appreciated that other methods of testing for floating gate defects in integrated circuits may be realized by employing the teachings of the present invention. That is, by irradiating an integrated circuit with ultraviolet light, floating gates can then be set to an intermediate operating value which will be useful in detecting floating gate defects in the integrated circuit.

In the foregoing detailed description, a method for detecting defects in an integrated circuit is described. The method of the present invention has been described with reference to specific exemplary embodiments thereof. It will, however, be evident that various modifications and changes may be made thereto without departing from the broader spirit and scope of the present invention. The present specification and drawings are accordingly to be regarded as illustrative rather than restrictive.

What is claimed is:

1. In a CMOS integrated circuit, a method for detecting an open circuit defect in the CMOS integrated circuit comprising the steps of:

setting a first and a second node to a first potential, wherein the integrated circuit is coupled between the first and second nodes;

irradiating the integrated circuit;

setting the first node to the first potential and setting the second node to a second potential; and performing IDDQ testing of the integrated circuit.

2. The method described in claim 1 including the additional step of performing Boolean testing of the integrated circuit.

3. In a CMOS integrated circuit, a method for detecting an open circuit defect in the CMOS integrated circuit comprising the steps of:

setting a first and a second node to a first potential, wherein the integrated circuit is coupled between the first and second nodes;

irradiating the integrated circuit;

setting the first node to the first potential and setting the second node to a second potential; and performing Boolean testing of the integrated circuit.

4. The method described in claim 3 including the additional step of performing IDDQ testing of the integrated circuit.

* * * * *